(12) United States Patent
Tam

(10) Patent No.: US 11,011,505 B2
(45) Date of Patent: May 18, 2021

(54) SEMICONDUCTOR MEMORY AND MANUFACTURING METHOD THEREOF

(71) Applicant: Toshiba Memory Corporation, Tokyo (JP)

(72) Inventor: Poho Tam, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,597

(22) Filed: Mar. 1, 2019

(65) Prior Publication Data

US 2020/0083204 A1    Mar. 12, 2020

(30) Foreign Application Priority Data

Sep. 12, 2018   (JP) .............................. JP2018-170553

(51) Int. Cl.
| | | |
|---|---|---|
| *H01L 23/28* | (2006.01) | |
| *H01L 25/18* | (2006.01) | |
| *H01L 23/00* | (2006.01) | |
| *H01L 25/00* | (2006.01) | |

(52) U.S. Cl.
CPC .............. *H01L 25/18* (2013.01); *H01L 24/32* (2013.01); *H01L 24/48* (2013.01); *H01L 24/73* (2013.01); *H01L 25/50* (2013.01); *H01L 2224/32106* (2013.01); *H01L 2224/32145* (2013.01); *H01L 2224/32225* (2013.01); *H01L 2224/48225* (2013.01); *H01L 2224/73265* (2013.01)

(58) Field of Classification Search
CPC ......... H01L 24/48; H01L 24/73; H01L 24/33; H01L 2224/32106; H01L 2224/32145

USPC .......................................... 257/783, 686, 723
See application file for complete search history.

(56) References Cited

U.S. PATENT DOCUMENTS

| | | | | |
|---|---|---|---|---|
| 6,762,488 B2 * | 7/2004 | Maeda | ................ | H01L 23/3128 257/686 |
| 8,278,764 B1 * | 10/2012 | Crisp | .................. | H01L 25/0652 257/774 |
| 8,513,813 B2 * | 8/2013 | Crisp | .................. | H01L 25/0655 257/773 |
| 8,653,676 B2 * | 2/2014 | Kim | ........................ | H01L 24/19 257/790 |
| 8,803,334 B2 * | 8/2014 | Choi | ....................... | H01L 24/24 257/777 |
| 8,823,165 B2 * | 9/2014 | Haba | ................... | H01L 25/0652 257/723 |
| 8,896,111 B2 | 11/2014 | Tanimoto et al. | | |

(Continued)

FOREIGN PATENT DOCUMENTS

| | | |
|---|---|---|
| JP | 2012-129464 A | 7/2012 |
| JP | 2012-216644 A | 11/2012 |

(Continued)

*Primary Examiner* — Nitin Parekh
(74) *Attorney, Agent, or Firm* — Kim & Stewart LLP

(57) ABSTRACT

A semiconductor memory includes a substrate, a memory controller, a plurality of memory modules, and a cover layer. The memory controller is provided on an upper surface of the substrate. Each of the memory modules partially covers an upper surface of the memory controller and the upper surface of the substrate through at least an adhesive layer. The cover layer is on the upper surface of the substrate and encloses the memory controller and the plurality of memory modules between the substrate and the cover layer.

11 Claims, 5 Drawing Sheets

(56) References Cited

U.S. PATENT DOCUMENTS

| | | | |
|---|---|---|---|
| 9,465,755 B2 | 10/2016 | Hadley | |
| 2002/0014689 A1 | 2/2002 | Lo et al. | |
| 2002/0096755 A1* | 7/2002 | Fukui | H01L 24/27 |
| | | | 257/686 |
| 2003/0107138 A1* | 6/2003 | Tian | H01L 23/3121 |
| | | | 257/787 |
| 2003/0141583 A1* | 7/2003 | Yang | H01L 21/563 |
| | | | 257/686 |
| 2006/0151865 A1 | 7/2006 | Han et al. | |
| 2009/0161402 A1* | 6/2009 | Oh | G11C 5/02 |
| | | | 365/51 |
| 2012/0153432 A1 | 6/2012 | Karakane et al. | |
| 2012/0248628 A1 | 10/2012 | Tanaka et al. | |
| 2014/0070428 A1 | 3/2014 | Tanimoto et al. | |
| 2014/0252640 A1* | 9/2014 | Kwak | H01L 23/5381 |
| | | | 257/773 |
| 2014/0264906 A1* | 9/2014 | Fai | H01L 23/49838 |
| | | | 257/774 |
| 2015/0014862 A1* | 1/2015 | Kwon | H01L 23/552 |
| | | | 257/775 |
| 2018/0130781 A1* | 5/2018 | Kang | H01L 25/0652 |
| 2019/0057952 A1* | 2/2019 | Chen | H04N 5/2253 |

FOREIGN PATENT DOCUMENTS

| | | |
|---|---|---|
| JP | 2013-098240 A | 5/2013 |
| JP | 2014-053538 A | 3/2014 |
| JP | 2017-054876 A | 3/2017 |
| JP | 2017-054879 A | 3/2017 |
| TW | M385089 U | 7/2010 |
| TW | 201112363 A | 4/2011 |

* cited by examiner

SEMICONDUCTOR MEMORY AND MANUFACTURING METHOD THEREOF

CROSS-REFERENCE TO RELATED APPLICATION

This application is based upon and claims the benefit of priority from Japanese Patent Application No. 2018-170553, filed on Sep. 12, 2018, the entire contents of which are incorporated herein by reference.

FIELD

Embodiments described herein relate generally to a semiconductor memory and a manufacturing method thereof.

BACKGROUND

A semiconductor memory having a plurality of memory elements (e.g., memory modules) and a memory controller for controlling reading of data from the memory elements and writing of data to the memory elements is known.

DETAILED DESCRIPTION

Figure 1:
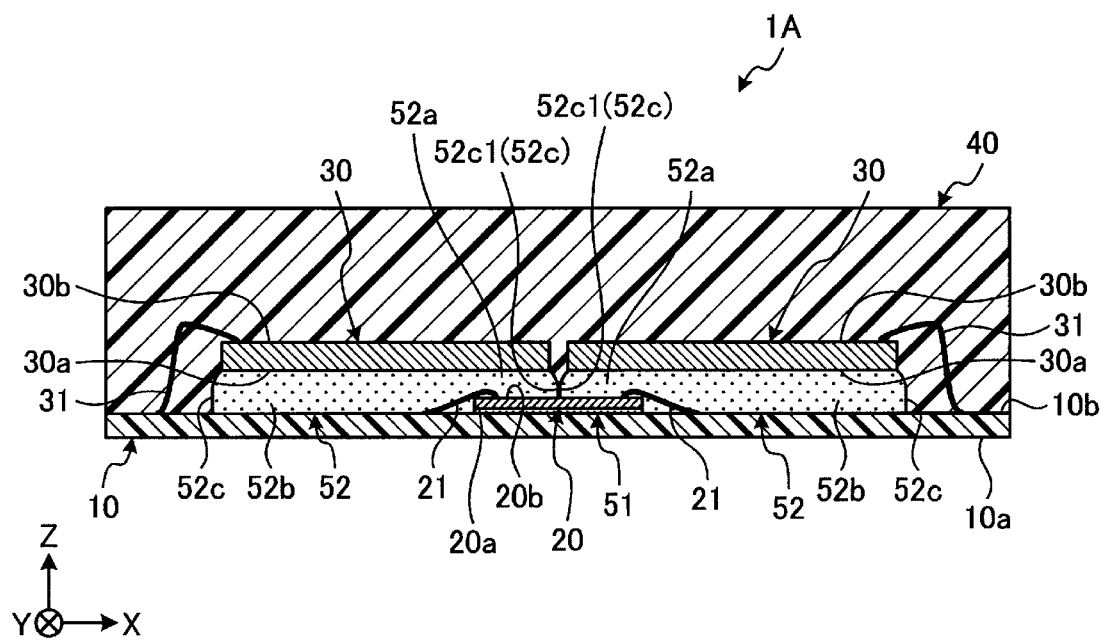
FIG. 1 illustrates a schematic cross-sectional view of a semiconductor memory according to a first embodiment.

In general, according to an embodiment, a semiconductor memory includes a substrate, a memory controller, a plurality of memory modules, and a cover layer. The memory controller is provided on an upper surface of the substrate. Each of the memory modules partially covers an upper surface of the memory controller and the upper surface of the substrate through at least an adhesive layer. The cover layer is on the upper surface of the substrate and encloses the memory controller and the plurality of memory modules between the substrate and the cover layer.

Illustrative embodiments of the semiconductor memory will be disclosed below. The structures and methods (technical features) of the embodiments illustrated below and operations and results (advantageous effects) brought about by the structures and the methods are examples. The same structures are included in a plurality of embodiments exemplified below. Therefore, in each embodiment, the same operations and advantageous effects based on the same structures can be obtained. In the following, the same reference numerals are given to the same constituent elements and redundant description thereof will be omitted.

For convenience, arrows indicating directions are shown in each Figure. A direction X, a direction Y, and a direction Z are orthogonal to each other. The direction X and the direction Y are directions along a rear surface 10$a$ and a front surface 10$b$ of a substrate 10, and the direction Z is a thickness direction of the substrate 10. In the following, for convenience, the direction in which the front surface 10$b$ of the substrate 10 faces, that is, an upper side in FIG. 1 will be simply referred to as an upper side, and the direction in which the rear surface 10$a$ of the substrate 10 faces, that is, a lower side in FIG. 1 will be simply referred to as a lower side. The direction X is the right direction in each Figure.

First Embodiment

Figure 2:
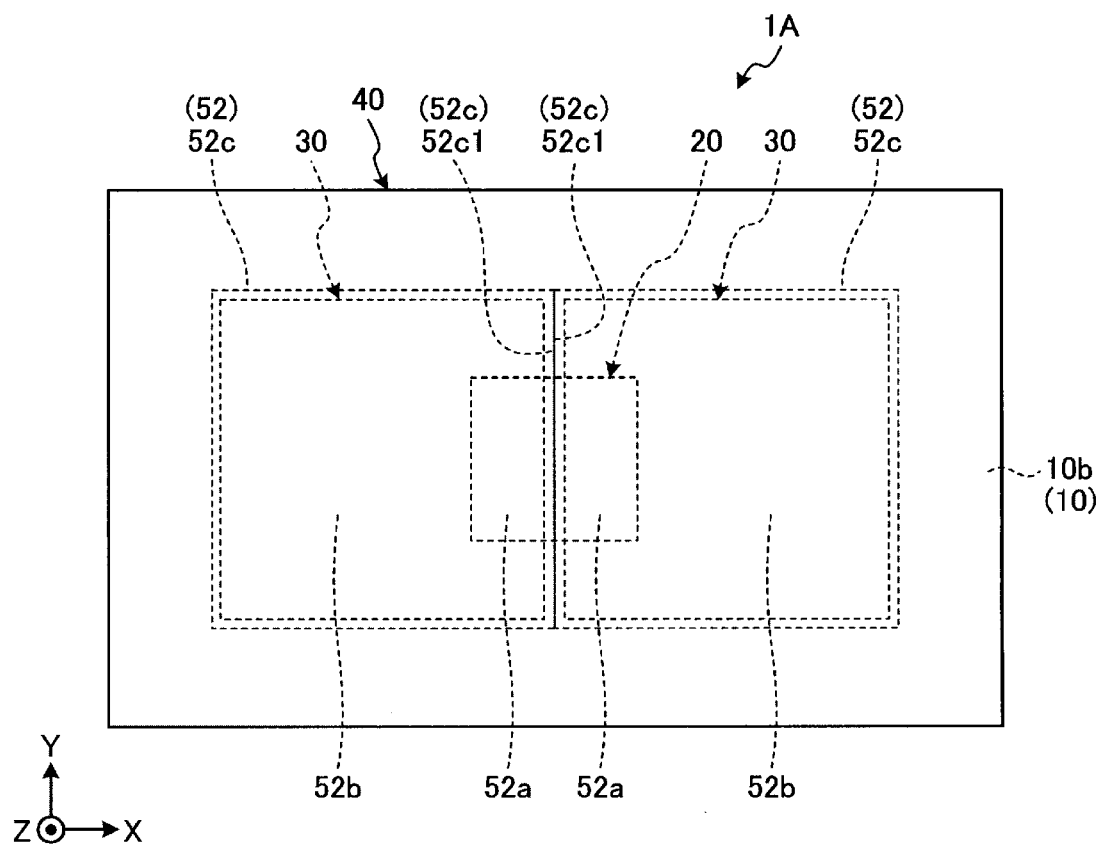
FIG. 2 illustrates a schematic plan view of the semiconductor memory according to the first embodiment.

FIG. 1 illustrates a cross-sectional view of a semiconductor memory 1A taken along the direction Z, and FIG. 2 illustrates a plan view of the semiconductor memory 1A as seen in the direction opposite to the direction Z.

As shown in FIG. 1, the semiconductor memory 1A includes the substrate 10, a controller (e.g., memory controller) 20, memory elements (e.g., memory chips and memory modules) 30, and a cover layer 40.

The substrate 10 is a circuit board, for example, a printed wiring board. The substrate 10 has a flat plate shape, and has the rear surface 10$a$ and the front surface 10$b$ that are parallel to each other. Both the rear surface 10$a$ and the front surface 10$b$ intersect the direction Z and are substantially orthogonal to the direction Z.

The controller 20 controls reading of data from the memory elements 30 and writing of data to the memory elements 30. The controller 20 may perform control other than the reading and the writing. The controller 20 has a flat rectangular parallelepiped shape, and has a rear surface 20$a$ and a front surface 20$b$ that are parallel to each other. Both the rear surface 20$a$ and the front surface 20$b$ intersect the direction Z and are substantially orthogonal to the direction Z.

The controller 20 is mounted on the front surface 10$b$ of the substrate 10. For example, the controller 20 may be adhered onto the front surface 10$b$ via a die attach film 51 (DAF51). The DAF 51 is interposed between the front surface 10$b$ and the rear surface 20$a$, and bonds the front surface 10$b$ and the rear surface 20$a$. The DAF 51 may also be referred to as an adhesive layer. The DAF 51 is provided on the rear surface of a wafer (not shown) integrally having a plurality of regions of controllers 20 in a manufacturing process of the controller 20. By cutting the wafer by dicing and dividing it into the plurality of controllers 20, the DAF 51 is provided on the rear surface 20$a$ of each controller 20. The controller 20 is electrically connected to a conductor portion (not shown) such as a wiring pattern of the substrate 10 via a bonding wire 21.

The memory element 30 is a nonvolatile memory, for example, a NAND flash memory. The memory element 30 has a flat rectangular parallelepiped shape, and has a rear surface 30$a$ and a front surface 30$b$ that are parallel to each other. Both the rear surface 30$a$ and the front surface 30$b$ intersect the direction Z, and are substantially orthogonal to the direction Z in the present embodiment.

The two memory elements 30 are mounted on the front surface 10b of the substrate 10. The two memory elements 30 are aligned with a gap therebetween in the direction X. The two memory elements 30 are adhered onto the front surface 10b via respective DAFs 52. The DAF 52 is interposed between the front surface 10b and the rear surface 30a, and bonds the front surface 10b and the rear surface 30a. The DAF 52 is also interposed between the front surface 20b of the controller 20 and the rear surface 30a, and bonds the front surface 20b and the rear surface 30a. The DAF 52 is provided on the rear surface of a wafer (not shown) integrally having a plurality of regions of the memory elements 30 in the manufacturing process of the memory element 30. By cutting the wafer by dicing and dividing it into the plurality of memory elements 30, the DAF 52 is provided on the rear surface 30a of each memory element 30. The memory elements 30 are electrically connected to conductor portions (not shown) such as wiring patterns of the substrate 10 via bonding wires 31, respectively.

The memory element 30 and the DAF 52 partially cover the controller 20. In other words, the memory element 30 and the DAF 52 partially overlap with the controller 20 in the direction Z. That is, the memory element 30 and the DAF 52 cover the front surface 20b of the controller 20 and the front surface 10b of the substrate 10. As shown in FIGS. 1 and 2, an intermediate position between rows of the two memory elements 30 arranged along the direction X, in other words, a gap between the two memory elements 30 overlaps on a central portion of the controller 20.

The DAF 52 has a first portion 52a and a second portion 52b. The first portion 52a is a portion that covers the controller 20, in other words, a portion that is located on the controller 20. The second portion 52b is a portion that deviates from the controller 20 and covers the front surface 10b, in other words, a portion that is located on the front surface 10b. As shown in FIGS. 1 and 2, in a plan view seen in the direction Z, the second portion 52b is wider than the first portion 52a. Although the memory element 30 is partially placed on the controller 20, the memory element 30 is less likely to be inclined on the controller 20.

As shown in FIG. 1, a peripheral edge portion 52c of the DAF 52 bulges outwardly along the front surface 10b of the substrate 10 toward a periphery. Thus, at the boundary portion between the two DAFs 52, sides 52c1 and 52c1, which are parts of the peripheral edge portion 52c thereof, are in contact with each other without gaps and cover the controller 20.

The cover layer 40 is provided on the front surface 10b of the substrate 10 and covers the substrate 10. The cover layer 40 and the substrate 10 enclose the controller 20 and the two memory elements 30. The cover layer 40 is made of an insulating synthetic resin material. The synthetic resin material is, for example, an epoxy resin mixed with an inorganic material such as silicon dioxide. The cover layer 40 may also be referred to as a sealing resin.

Figure 3A:
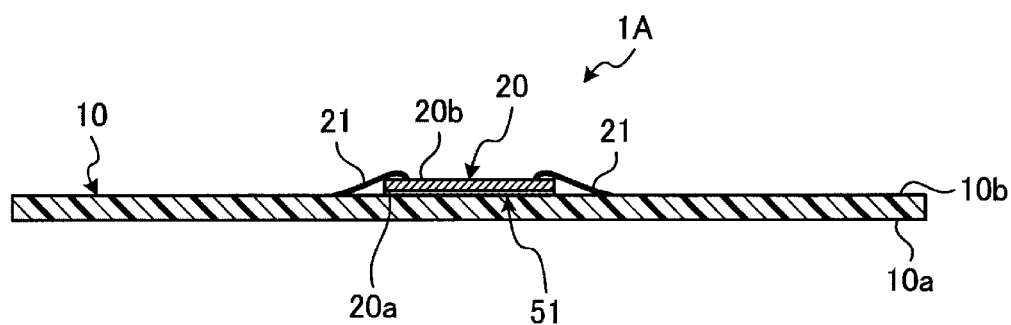
FIG. 3A illustrates a schematic cross-sectional view of a semiconductor memory to illustrate an initial step in a manufacturing method of the semiconductor memory according to an embodiment.

FIGS. 3A to 3D show a manufacturing process of the semiconductor memory 1A. First, as shown in FIG. 3A, the controller 20 is mounted on the front surface 10b of the substrate 10. The controller 20 is adhered onto the front surface 10b via the DAF 51. Wire bonding is performed, and the controller 20 is electrically connected to the conductor portion (not shown) of the substrate 10 via the bonding wire 21.

Figure 3B:
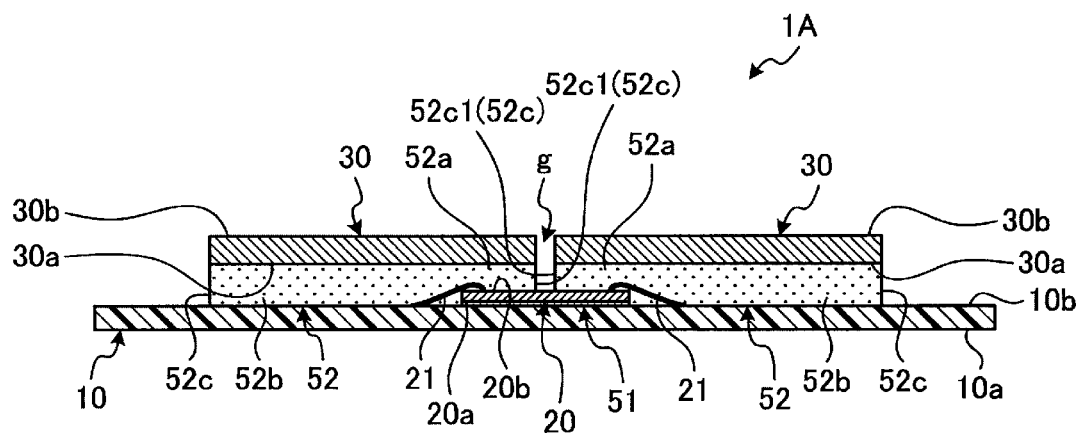
FIG. 3B illustrates a schematic cross-sectional view to illustrate a step subsequent to FIG. 3A in the manufacturing method of the semiconductor memory according to the embodiment.

Next, as shown in FIG. 3B, the two memory elements 30 are adhered via the respective DAFs 52 so as to cover the front surface 10b of the substrate 10 and the front surface 20b of the controller 20. The DAF 52 is placed on the front surface 10b and the front surface 20b. The two DAFs 52 are arranged in the direction X with a gap g therebetween.

Figure 3C:
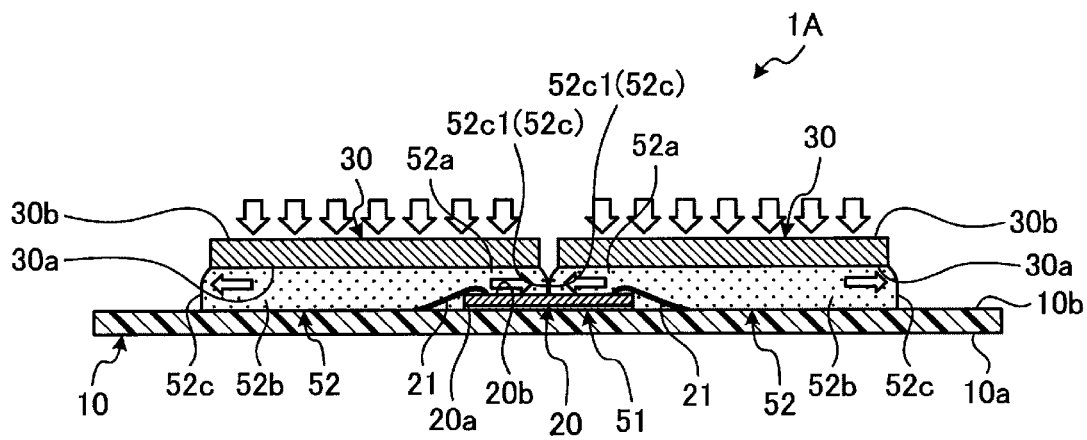
FIG. 3C illustrates a schematic cross-sectional view to illustrate a step subsequent to FIG. 3B in the manufacturing method of the semiconductor memory according to the embodiment.

Next, as shown in FIG. 3C, the front surfaces 30b of the two memory elements 30 are pressed toward the front surface 10b of the substrate 10, that is, in the direction opposite to the direction Z. Through this step, the two DAFs 52 are compressed so that the height in the direction Z is reduced, and the peripheral edge portions 52c of the two DAFs 52 are respectively pushed outward along the front surface 10b of the substrate 10 toward the periphery and bulge. Thus, the sides 52c1 and 52c1 of the two DAFs 52, which face each other with the gap g in the direction X in FIG. 3B, approach each other and come into contact with each other as shown in FIG. 3C. Thus, the gap g is closed, and the controller 20 is entirely covered by the DAF 52. In the state of FIG. 3C, the DAFs 51 and 52 are solidified.

Figure 3D:
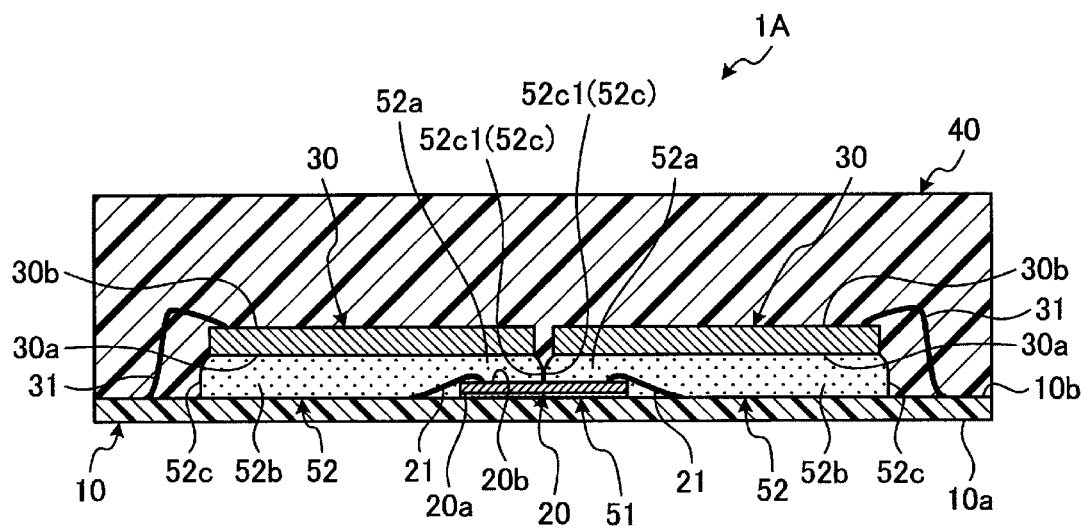
FIG. 3D illustrates a schematic cross-sectional view to illustrate a step subsequent to FIG. 3C in the manufacturing method of the semiconductor memory according to the embodiment.

Next, as shown in FIG. 3D, the cover layer 40 is placed on the front surface 10b of the substrate 10, and the cover layer 40 covers the front surface 10b of the substrate 10 and the two memory elements 30 exposed on the front surface 10b. Thus, the substrate 10 and the cover layer 40 enclose the controller 20 and the two memory elements 30.

As described above, in the present embodiment, the plurality of memory elements 30 are adhered onto the front surface 10b (an example of a first surface) of the substrate 10 and the front surface 20b of the controller 20 via the DAF 52 (an example of an adhesive layer) so as to partially cover the controller 20. It is assumed that the memory element 30 is mounted on the controller 20 via the DAF 52 so as to cover the entirety thereof. In this case, the rear surface 30a of the memory element 30 does not has a sufficient width with respect to the front surface 10b of the substrate 10. Therefore, the inclination of the memory element 30 occurs, which may result in adhesion failure such as a gap (void) between the front surface 10b and the DAF 52, which might cause a reduction in yield. In this respect, according to the present embodiment, as the plurality of memory elements 30 partially cover the controller 20 respectively, the DAF 52 for each memory element 30 can be on a wider area of the front surface 10b. In other words, the second portion 52b of the DAF 52 that is located on the front surface 10b and deviates from the controller 20 is wider than the first portion 52a of the DAF 52 that is located on the controller 20. Therefore, although the memory element 30 and the DAF 52 are placed on the controller 20, the memory element 30 and the DAF 52 are hardly inclined. That is, according to the present embodiment, for example, it is possible to obtain an advantageous effect that the front surface 10b and the memory elements 30 can be adhered to each other more accurately or more surely by the DAFs 52.

According to the present embodiment, the plurality of memory elements 30 are adhered onto the front surface 10b via the respective DAFs 52. If the plurality of memory elements 30 are bonded with one relatively wide adhesive layer, it may take more time and labor to manufacture and there may be a concern that the cost may increase. In this respect, according to the embodiment, since the plurality of memory elements 30 are adhered onto the front surface 10b via respective DAFs 52, it is possible to reduce the manufacturing labor and cost, for example, compared with the case where one relatively wide adhesive layer is used. The DAF 52 may be collectively provided to the plurality of memory elements 30 before cutting the wafer by dicing and dividing it into the plurality of memory elements 30. That is, the plurality of memory elements 30 with DAFs 52 may be formed by cutting the wafer to which the DAF 52 is attached by dicing. Therefore, according to the present embodiment, for example, it is possible to further reduce the manufacturing labor and further reduce the cost.

In the present embodiment, the two DAFs 52 are in contact with each other on the controller 20. With this structure, for example, the controller 20 is covered with the plurality of DAFs 52 made of the same material without a gap or with a small gap. Therefore, it is possible to further reduce distortion of the semiconductor memory 1A due to the temperature change.

In the present embodiment, the peripheral edge portion 52c of the DAF 52 bulges outwardly, and the sides 52c1 of the respective peripheral edge portion 52c are in contact with each other on the controller 20. With this structure, for example, by pressing the memory element 30 toward the front surface 10b of the substrate 10 to cause the DAFs 52 to bulge outwardly, a structure in which the peripheral edge portions 52c of the respective DAFs 52 are in contact with each other on the controller 20, that is, a structure in which the respective DAFs 52 are in contact with each other can be relatively easily obtained.

Modification of First Embodiment

Figure 4:
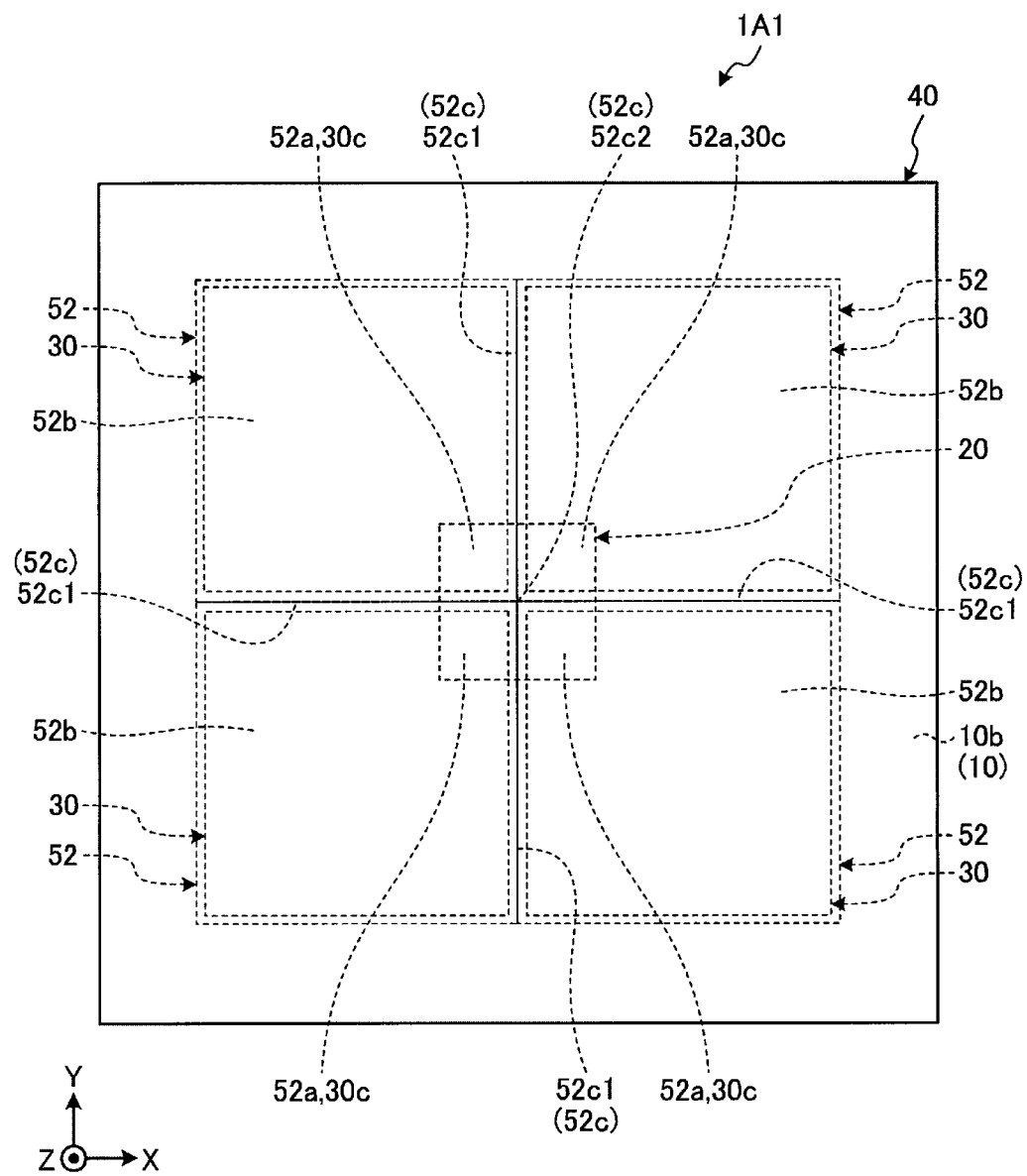
FIG. 4 illustrates a schematic plan view of a semiconductor memory according to a modification of the first embodiment.

FIG. 4 illustrates a plan view of a semiconductor memory 1A1 according to a modification as seen in the direction opposite to the direction Z. As shown in FIG. 4, the modification has four memory elements 30.

In the present modification, the four memory elements 30 are disposed on the front surface 10b of the substrate 10. Each memory elements 30 is mounted on the front surface 10b in the same manner as that in the first embodiment.

The four memory elements 30 are arranged diagonally and like tiles in the directions X and Y with gaps between them, so that one corner portion 30c of each memory element 30 is located on the controller 20. That is, the corner portion 30c of each memory element 30 and the controller 20 overlap in the direction Z. In the plan view of FIG. 4, the center of gravity (centroid) of the four memory elements 30 and the center of the controller 20 substantially overlap.

Also in the present modification, the semiconductor memory 1A1 can be manufactured by a similar or the same process as that in FIG. 3A to FIG. 3D. Therefore, the peripheral edge portions 52c of the four DAFs 52 bulges outwardly along the front surface 10b of the substrate 10, and adjacent peripheral edge portions 52c are in contact with each other. On the controller 20, the sides 52c1 of the peripheral edge portions 52c of the two DAFs 52 adjacent to each other in the direction X or the direction Y are in contact with each other, and the corners 52c2 of the peripheral edge portions 52c of the four DAFs 52 are in contact with each other.

Thus, in the present modification, the four DAFs 52 are in contact with each other on the controller 20. Therefore, according to the present modification, for example, since the controller 20 is covered with the plurality of DAFs 52 made of the same material without gaps or with a small gap on the controller 20, the distortion of the semiconductor memory 1A1 due to a temperature change hardly occurs.

Second Embodiment

Figure 5:
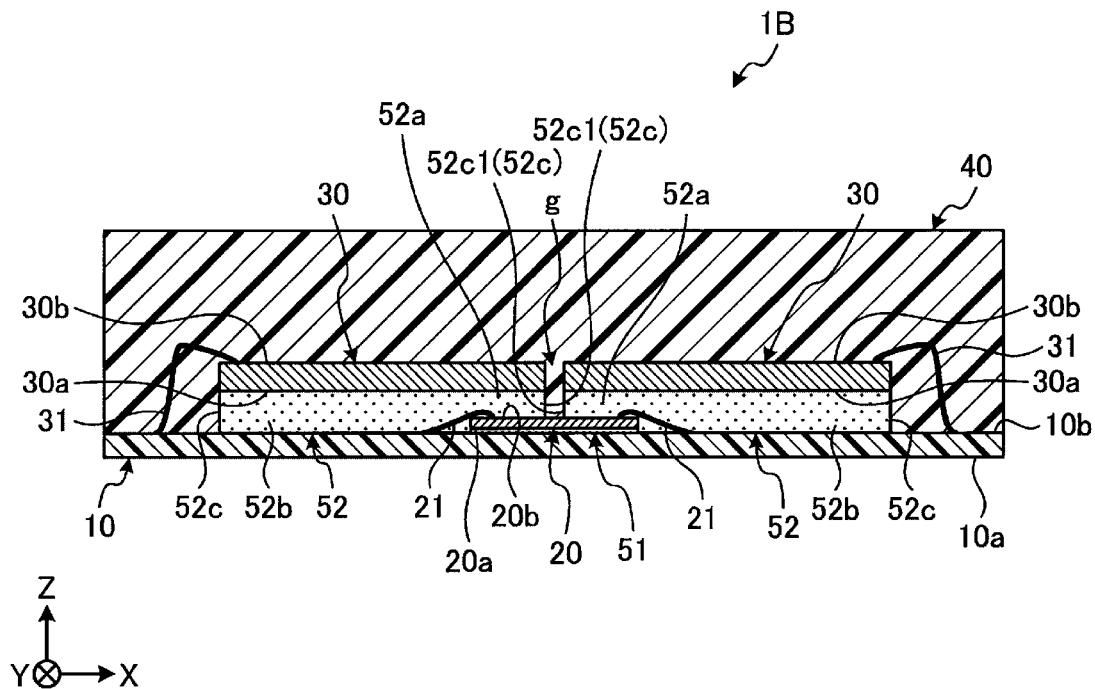
FIG. 5 illustrates a schematic cross-sectional view of a semiconductor memory according to a second embodiment.

FIG. 5 illustrates a cross-sectional view of a semiconductor memory 1B according to a second embodiment taken along the direction Z. The semiconductor memory 1B has substantially the same structure as the semiconductor memory 1A of the first embodiment, and may be manufactured by the same manufacturing process. It should be noted that, in the present embodiment, the step of FIG. 3C is not performed. Therefore, the peripheral edge portion 52c of the DAF 52 does not bulge outwardly, and the peripheral edge portions 52c of the plurality of DAFs 52 are separated from each other with a gap g between them. With this structure, for example, since the step of FIG. 3C is not performed, the number of steps decreases, the time required for manufacturing can be shortened, and the throughput of manufacturing the semiconductor memory 1B is easily improved.

Third Embodiment

Figure 6:
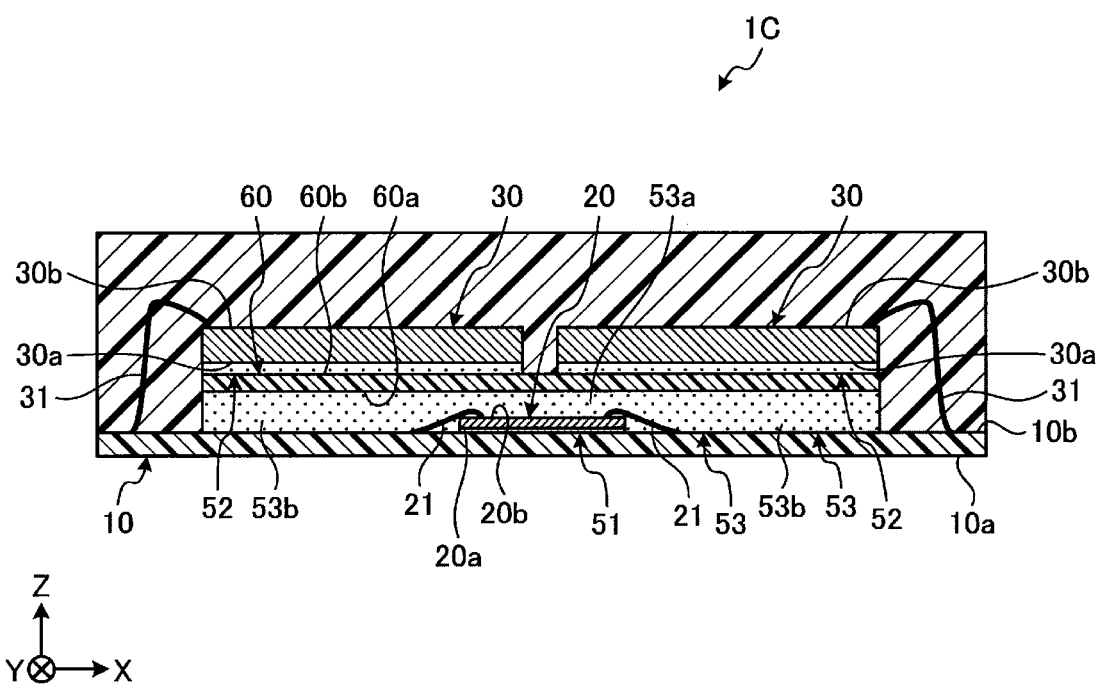
FIG. 6 illustrates a schematic cross-sectional view of a semiconductor memory according to a third embodiment.

FIG. 6 illustrates a cross-sectional view of a semiconductor memory 1C according to a third embodiment taken along the direction Z. In the present embodiment, a dummy substrate 60 is interposed between the substrate 10 and the memory element 30. The dummy substrate 60 has a flat rectangular parallelepiped shape, and has a rear surface 60a and a front surface 60b that are parallel to each other. Both the rear surface 60a and the front surface 60b intersect the direction Z, and are substantially orthogonal to the direction Z in the present embodiment. The dummy substrate 60 is made by cutting an unprocessed wafer (with DAF 53) without a conductor portion. The dummy substrate 60 may also be referred to as an intervening member, a support member, or a balancer. The manufacturing method of the dummy substrate 60 and the adhesive layer is not limited to this example.

For example, the dummy substrate 60 may be adhered onto the front surface 10b via the DAF 53. The DAF 53 is interposed between the front surface 10b and the rear surface 60a, and bonds the front surface 10b and the rear surface 60a. The DAF 53 is also interposed between the front surface 20b of the controller 20 and the rear surface 60a, and bonds the front surface 20b and the rear surface 60a. The DAF 53 may also be referred to as an adhesive layer. The DAF 53 is provided on the rear surface of an unprocessed silicon wafer (not shown) integrally having a plurality of regions of the dummy substrate 60. By cutting the wafer by dicing and dividing it into a plurality of dummy substrates 60, the DAF 53 is provided on the rear surface 60a of each dummy substrate 60. The DAF 53 is an example of a first adhesive layer.

The dummy substrate 60 and the DAF 53 cover the controller 20. In other words, the dummy substrate 60 and the DAF 53 overlap with the controller 20 in the direction Z. That is, the dummy substrate 60 and the DAF 53 cover the front surface 20b of the controller 20 and the front surface 10b of the substrate 10. As shown in FIG. 6, the central portion of the dummy substrate 60 overlaps on a central portion of the controller 20. The dummy substrate 60 and the DAF 53 cover the controller 20 so as to straddle the controller 20.

The DAF 53 has a first portion 53a and a second portion 53b. The first portion 53a is a portion that straddles and covers the controller 20 in the direction X, in other words, the direction along the front surface 10b, and in other words, a portion that is located on the controller 20. The second portion 53b is a portion that deviates from the controller 20 and covers the front surface 10b, in other words, a portion that is located on the front surface 10b. In the plan view seen in the direction Z, the second portion 53b is wider than the first portion 53a, and the dummy substrate 60 and the DAF 53 straddle the controller 20. Therefore, although the dummy substrate 60 is placed on the controller 20, the dummy substrate 60 is hardly inclined.

The two memory elements 30 are mounted on the front surface 60b of the dummy substrate 60. Also in the present embodiment, the two memory elements 30 are aligned with a gap in the direction X. The two memory elements 30 are adhered onto the front surface 60b via the respective DAFs 52. The DAF 52 is interposed between the front surface 60b and the rear surface 30a, and bonds the front surface 60b and the rear surface 30a. The memory elements 30 are electrically connected to conductor portions (not shown) such as wiring patterns of the substrate 10 via a bonding wire 31, respectively. As is apparent from FIG. 6, the dummy substrate 60 has an enough width that the plurality of memory elements 30 aligned with gaps in the direction along the front surface 60b are mounted. The DAF 52 is an example of a second adhesive layer. The front surface 60b is an example of a second surface.

In the present embodiment as described above, the semiconductor memory 1C includes the dummy substrate 60 (an example of the intervening member). The dummy substrate 60 is adhered onto the front surface 10b (an example of the first surface) of the substrate 10 and the front surface 20b of the controller 20 via the DAF 53 (an example of the first adhesive layer), and the two memory elements 30 are adhered onto the front surface 60b (an example of the second surface) of the dummy substrate 60 via the DAF 52 (an example of the second adhesive layer). In this structure, the DAF 53 can exist on a wider area of the front surface 10b. In other words, the second portion 53b of the DAF 53 that is located on the front surface 10b and deviates from the controller 20 is wider than the first portion 53a of the DAF 53 that is located on the controller 20. Therefore, although the dummy substrate 60 and the DAF 53 are placed on the controller 20, the dummy substrate 60 and the DAF 53 are hardly inclined. That is, according to the present embodiment, for example, it is possible to obtain an advantageous effect that the front surface 10b and the DAF 52 can be adhered more accurately or more surely. That is, according to the present embodiment, for example, it is possible to obtain an advantageous effect that the front surface 10b and the memory element 30 can be adhered more accurately or more surely.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Specification such as a configuration and a shape (a structure, a type, a direction, a format, a size, a length, a width, a height, the number of elements, an arrangement, a position, and a material) may be changed appropriately. For example, the number of memory elements and the arrangement of them are no limited to the embodiments but may be set in various manners. The memory elements may be stacked in a thickness direction.

What is claimed is:

1. A semiconductor memory comprising
a substrate;
a first chip provided on an upper surface of the substrate;
a plurality of first bonding wires connecting the substrate and the first chip, each of the first bonding wires being wire-bonded to the substrate and the first chip;
a plurality of first modules, each of the first modules partially covering an upper surface of the first chip and the upper surface of the substrate through at least an adhesive layer;
a plurality of second bonding wires connecting the substrate and the plurality of first modules, each of the second bonding wires being wire-bonded to the substrate and one of the plurality of first modules; and
a cover layer covering the upper surface of the substrate and upper surfaces of the plurality of first modules,
wherein the plurality of first bonding wires are embedded in the adhesive layer, and the plurality of second bonding wires are embedded in the cover layer.

2. The semiconductor memory according to claim 1, wherein
the plurality of first modules include a first semiconductor chip and a second semiconductor chip, the first semiconductor chip covering a first region of the upper surface of the first chip through a first adhesive layer, and the second semiconductor chip covering a second region of the upper surface of the first chip through a second adhesive layer.

3. The semiconductor memory according to claim 2, wherein a side surface of the first adhesive layer above the first chip and a side surface of the second adhesive layer above the first chip are in contact with each other.

4. The semiconductor memory according to claim 3, wherein
the side surface of the first adhesive layer and the side surface of the second adhesive layer both have a convex portion, and
the convex portion on the side surface of the first adhesive layer and the convex portion on the side surface of the second adhesive layer are in contact with each other.

5. The semiconductor memory according to claim 2, wherein a side surface of the first adhesive layer above the first chip and a side surface of the second adhesive layer above the first chip are spaced apart from each other.

6. The semiconductor memory according to claim 2, wherein
the plurality of first modules further include a third semiconductor chip and a fourth semiconductor chip, the third semiconductor chip covering a third region of the upper surface of the first chip through a third adhesive layer, and the fourth semiconductor chip covering a fourth region of the upper surface of the first chip through a fourth adhesive layer.

7. The semiconductor memory according to claim 6, wherein
a first side surface of the first adhesive layer above the first chip and a side surface of the second adhesive layer above the first chip are in contact with each other, and
a second side surface of the first adhesive layer above the first chip and a side surface of the third adhesive layer above the first chip are in contact with each other.

8. The semiconductor memory according to claim 7, wherein
a third side surface of the fourth adhesive layer above the first chip and a side surface of the second adhesive layer above the first chip are in contact with each other, and
a fourth side surface of the fourth adhesive layer above the first chip and a side surface of the third adhesive layer above the first chip are in contact with each other.

9. The semiconductor memory according to claim 1, wherein
the adhesive layer encloses the first chip,
the semiconductor memory further comprises an intervening member entirely covering an upper surface of the first chip through the adhesive layer, and
the plurality of first modules are above the intervening member.

10. The semiconductor memory according to claim 9, wherein the cover layer encloses the intervening member.

11. A semiconductor memory comprising:
a substrate;
a first chip provided on an upper surface of the substrate;
a plurality of first bonding wires connecting the substrate and the first chip, each of the first bonding wires being wire-bonded to the substrate and the first chip;
an intervening member entirely covering an upper surface of the first chip through a first adhesive layer enclosing the first chip, wherein
a plurality of first modules, each of the first modules partially covering an upper surface of the intervening member through a plurality of second adhesive layers, respectively;
a plurality of second bonding wires connecting the substrate and the plurality of first modules, each of the second bonding wires being wire-bonded to the substrate and one of the first modules; and
a cover layer covering the upper surface of the substrate and upper surfaces of the plurality of first modules,
wherein the plurality of first bonding wires are embedded in the first adhesive layer, and the plurality of second bonding wires are embedded in the cover layer.

* * * * *